(12) United States Patent  (10) Patent No.: US 8,222,931 B2
Kim  (45) Date of Patent: *Jul. 17, 2012

(54) SEMICONDUCTOR DEVICE AND DRIVING METHOD THEREOF

(75) Inventor: Tae-Kyun Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/269,511

(22) Filed: Oct. 7, 2011

(65) Prior Publication Data

US 2012/0025878 A1  Feb. 2, 2012

Related U.S. Application Data

(63) Continuation of application No. 12/486,831, filed on Jun. 18, 2009, now Pat. No. 8,035,429.

(30) Foreign Application Priority Data

Dec. 30, 2008 (KR) .......................... 10-2008-0137057

(51) Int. Cl.
  *H03L 7/00* (2006.01)

(52) U.S. Cl. ......... 327/144; 327/141; 327/153; 327/161

(58) Field of Classification Search .................. 327/141, 327/144–163; 331/15–17; 375/373–376; 713/400, 401, 500–503
See application file for complete search history.

(56) References Cited

U.S. PATENT DOCUMENTS

| 7,490,257 | B2* | 2/2009 | Endo | 713/401 |
| 2006/0049863 | A1* | 3/2006 | Endo | 327/295 |
| 2007/0263460 | A1* | 11/2007 | Jang | 365/194 |
| 2008/0201596 | A1* | 8/2008 | Cho | 713/401 |
| 2008/0240327 | A1* | 10/2008 | Kim et al. | 375/376 |
| 2009/0121768 | A1* | 5/2009 | Lee | 327/299 |

* cited by examiner

*Primary Examiner* — Lincoln Donovan
*Assistant Examiner* — Brandon S Cole
(74) *Attorney, Agent, or Firm* — IP & T Group LLP

(57) ABSTRACT

A semiconductor device includes a plurality of synchronization clock generators configured to generate a plurality of synchronization clock signals by mixing phases of first and second source clock signals having an identical frequency, a first clock transmission path configured to sequentially apply the first source clock signal to the plurality of synchronization clock generators by transferring the first source clock signal in a forward direction, a second clock transmission path configured to sequentially apply the second source clock signal to the plurality of synchronization clock generators by transferring the second source clock signal in a backward direction, and a plurality of data output units configured to synchronize a plurality of data with the plurality of synchronization clock signals and outputting the synchronized plurality of data.

30 Claims, 12 Drawing Sheets

SEMICONDUCTOR DEVICE AND DRIVING METHOD THEREOF

CROSS-REFERENCE TO RELATED APPLICATIONS

This application is a continuation of U.S. patent application Ser. No. 12/486,831 filed on Jun. 18, 2009, now U.S. Pat. No. 8,035,429 which claims priority of Korean patent application number 10-2008-0137057 filed on Dec. 30, 2008. The disclosure of each of the foregoing applications is incorporated herein by reference in its entirety.

BACKGROUND OF THE INVENTION

The present invention relates to a semiconductor design technology, and more particularly, to a semiconductor device for generating a synchronization clock signal and outputting a plurality of data in synchronization with the synchronization clock signal, and a driving method thereof.

In general, a semiconductor memory device such as Double Data Rate Synchronous DRAM (DDR SDRAM) includes tens of millions of memory cells for storing data. Such a semiconductor memory device stores or outputs data according to a command from a central processing unit (CPU). For example, when a CPU requires a write operation, a semiconductor memory device stores data in a memory cell corresponding to an address inputted from the CPU. When a CPU requests to perform a read operation, a semiconductor memory device outputs data stored in a memory cell corresponding to an address inputted from the CPU. At this point, data inputted through a pad in a write operation is inputted to a memory cell through a data input path, and data stored in a memory cell is outputted through a pad after passing through a data output path for a read operation.

Lately, semiconductor memory devices are being manufactured for high integration, high speed operation, and large capacity. Accordingly, the number of pads has increased. A plurality of data outputted through a plurality of pads are transferred to other devices. Here, the semiconductor memory devices output a plurality of data by synchronizing the plurality of data with one synchronization clock signal generally. Therefore, a semiconductor memory device includes a circuit for synchronizing a plurality of data with a synchronization clock signal. Not only the semiconductor memory device but also a general semiconductor device includes a circuit for performing such a synchronization operation in order to process a plurality of data.

FIG. 1 is a block diagram illustrating a partial structure of a conventional semiconductor device.

Referring to FIG. 1, a typical semiconductor device includes a clock driver 110, a plurality of synchronizers 130, a plurality of data drivers 150, and a plurality of pads 170. For illustration purposes, FIG. 1 shows the typical semiconductor device which includes 16 pads 170, that is, $0^{th}$ to $15^{th}$ PAD as an example. Accordingly, the typical semiconductor device includes 16 data drivers 150 such as $0^{th}$ to $15^{th}$ DATA DRIVER and 16 synchronizers 130 such as $0^{th}$ to $15^{th}$ SYNCHRONIZER corresponding to the 16 pads.

The clock driver 110 generates a synchronization clock signal CLK_SYC by buffering an internal clock signal CLK_INN. Generally a frequency of an internal clock signal CLK_INN and a frequency of a synchronization clock signal CLK_SYC are identical to each other.

The $0^{th}$ to $15^{th}$ synchronizers 130 receive the $0^{th}$ to $15^{th}$ data DAT<0:15>, synchronize the received data with the synchronization clock signal CLK_SYC, and output the synchronized data, respectively. The $0^{th}$ to $15^{th}$ data drivers 151 drive the synchronized data outputted from the $0^{th}$ to $15^{th}$ synchronizers 130 and output the driven data to the $0^{th}$ to $15^{th}$ pads 170. $0^{th}$ to $15^{th}$ output data DQ<0:15> outputted through the $0^{th}$ to $15^{th}$ pads 170 are transferred to devices that requires that. As described above, the $0^{th}$ to $15^{th}$ output data DQ<0:15> are generally synchronized with the synchronization clock signal CLK_SYC and outputted.

Hereinafter, problems of a typical semiconductor device having a structure shown in FIG. 1 will be described.

The synchronization clock signal CLK_SYC outputted from the clock driver 110 is applied to the $0^{th}$ to $15^{th}$ synchronizers 130 through a comparatively long clock transmission path LN. Therefore, the synchronization clock signal CLK_SYC is applied to each of the $0^{th}$ to $15^{th}$ synchronizers 130 at different time points. That is, if the synchronization clock signal CLK_SYC is applied to the $0^{th}$ synchronizer 130_0 at a time point $\Delta t0$, a time point of applying the synchronization clock signal CLK_SYC to the first synchronizer 130_1 becomes a time delayed by as much as $\Delta t1$ from $\Delta t0$, and a time of applying a synchronization clock signal CLK_SYC to the second synchronizer 130_2 becomes a time delayed by as much as $\Delta t2$ from $\Delta t0$. Therefore, a time point of applying the synchronization clock signal CLK_SYC to the $15^{th}$ synchronizer 130_15 becomes a time delayed by as much as $\Delta t15$ from $\Delta t0$. After all, a skew is reflected at the synchronization clock signal applied at different time points in view of $0^{th}$ to $15^{th}$ synchronizers 130.

FIG. 2 illustrates $0^{th}$ to $15^{th}$ output data DQ<0:15> outputted from $0^{th}$ to $15^{th}$ pads 170 of FIG. 1.

As shown in FIG. 2, the skew of the synchronization clock signal CLK_SYC is reflected at the $0^{th}$ to $15^{th}$ output data DQ<0:15>. That is, the $0^{th}$ to $15^{th}$ output data DQ<0:15> are outputted at the different time points corresponding to $\Delta t0$ to $\Delta t15$. Therefore, a valid data range of the $0^{th}$ to $15^{th}$ output data DQ<0:15> becomes very small compared to a real data range. The small valid data range means difficulty in recognizing $0^{th}$ to $15^{th}$ data DQ<0:15> in a device receiving the $0^{th}$ to $15^{th}$ output data DQ<0:15>. In order to resolve this problem, a semiconductor device of FIG. 3 was introduced.

FIG. 3 is a block diagram illustrating another conventional semiconductor device.

Compared to the semiconductor device of FIG. 1, a clock transmission path for transferring a synchronization clock signal CLK_SYC is hierarchically layered into a first clock transmission path LN1, a second clock transmission line LN2, and a third clock transmission paths LN3_1 and LN3_2. In other words, by grouping the synchronizers 310, clock transmission paths corresponding to each group are designed to have same length. For example, $0^{th}$ to $3^{rd}$ synchronizers 310 are classified as a first group, $12^{th}$ to $15^{th}$ synchronizers 330 are classified as a fourth group, and, not shown, $4^{th}$ to $7^{th}$ and $8^{th}$ to $11^{th}$ synchronizers are classified as a second and a third groups, respectively.

Therefore, the synchronization clock signal CLK_SYC is outputted as first to fourth synchronization clock signals CLK_SYC1, CLK_SYC2, CLK_SYC3, and CLK_SYC4 at the same operation time through the first, second, and third clock transmission paths LN1, LN2, and LN3_1 and LN3_2. The outputted first to fourth synchronization clock signals CLK_SYC1, CLK_SYC2, CLK_SYC3, and CLK_SYC4 are applied to each synchronizers in the first to fourth groups through fourth clock transmission paths LN4_1 and LN4_4. The first to fourth synchronization clock signals CLK_SYC1, CLK_SYC2, CLK_SYC3, and CLK_SYC4 are used to synchronize a plurality of data. Since subsequent operations are identical to the operation of the semiconductor device shown in FIG. 1, detail description thereof is omitted.

However, the semiconductor device of FIG. 3 has following problems. For illustration purposes, only the first and fourth groups will be representatively described.

The time of applying the first synchronization clock signal CLK_SYC1 to the first group and that of applying the fourth synchronization clock signal CLK_SYC4 to the fourth group are the same because the first, second, and third clock transmission paths LN1, LN2, LN3_1, and LN3_2 are identically arranged. However, the first clock signal CLK_SYC1 passes through the fourth clock transmission path LN4_1 corresponding to the first group while the first clock signal CLK_SYC1 is applied to the $0^{th}$ to $3^{rd}$ synchronizers of the first group. That is, the $0^{th}$ to $3^{rd}$ synchronizers of the first group receive the first synchronization clock signal CLK_SYC which $\Delta t0$, $\Delta t1$, $\Delta t2$, and $\Delta t3$ are respectively associated with. After all, the first synchronization clock signal CLK_SYC1, which is applied to the $0^{th}$ to $3^{rd}$ synchronizers at different time points, has an associated skew from the perspective of the $0^{th}$ to $3^{rd}$ synchronizers. The fourth synchronization clock signal CLK_SYC4, which is applied through the fourth clock transmission path LN4_4 corresponding to the fourth group, has a skew. Although not shown in the drawings, such a skew is reflected at each synchronizer in the second and third groups.

The skews of first to fourth synchronization clock signals CLK_SYC1, CLK_SYC2, CLK_SYC3, and CLK_SYC4 are reflected at the output signal of each synchronizer and influence the $0^{th}$ to $15^{th}$ output data DQ<0:15> through the $0^{th}$ to $15^{th}$ pads.

FIG. 4 illustrates $0^{th}$ to $15^{th}$ output data DQ<0:15> outputted from $0^{th}$ to $15^{th}$ pads of FIG. 3.

As shown in FIG. 4, the skew of the first to fourth synchronization clock signals CLK_SYC1, CLK_SYC2, CLK_SYC3, and CLK_SYC4 is reflected at the $0^{th}$ to $15^{th}$ output data DQ<0:15>. That is, the $0^{th}$ to $15^{th}$ output data DQ<0:15> are outputted at different time points corresponding to $\Delta t0$ to $\Delta t3$. Therefore, although the valid data range of the $0^{th}$ to $15^{th}$ output data DQ<0:15> may be obtained larger than it is in FIG. 2, but becomes smaller than a real data range.

Referring back to FIG. 3, the semiconductor device has the layered clock transmission paths for transmitting the synchronization clock signal CLK_SYC. It is preferred to dispose each of the layered clock transmission paths with the same structure. Accordingly, it is possible to stably secure a valid data range. If the layered clock transmission path is extended further, the valid data range can be extended further as well. That is, if the layering of the clock transmission path is extended to be directly corresponding to the $0^{th}$ to $15^{th}$ synchronizers, the valid data range can be extended further. However, such extension of the clock transmission path may become a limitation in designing a layout due to the high integration of the semiconductor device. The embodiments of the present invention relates to a semiconductor device that can secure sufficient valid data range without layering a clock transmission path.

SUMMARY OF THE INVENTION

Embodiments of the present invention are directed to providing a semiconductor device for generating a synchronization clock signal using a total delay amount of a clock transmission path.

Embodiments of the present invention are also directed to providing a semiconductor device for generating a plurality of synchronization clock signals toggling at the same time using source clock signals that are delayed corresponding to a total delay amount of a clock transmission path.

Embodiments of the present invention are also directed to providing a semiconductor device for eliminating a skew of a plurality of synchronization clock signals applied to a plurality of synchronization circuits.

In accordance with an aspect of the present invention, there is provided a semiconductor device including a plurality of synchronization clock generators configured to generate a plurality of synchronization clock signals by mixing phases of first and second source clock signals having an identical frequency, a first clock transmission path configured to sequentially apply the first source clock signal to the plurality of synchronization clock generators by transferring the first source clock signal in a forward direction, a second clock transmission path configured to sequentially apply the second source clock signal to the plurality of synchronization clock generators by transferring the second source clock signal in a backward direction, and a plurality of data output units configured to synchronize a plurality of data with the plurality of synchronization clock signals and outputting the synchronized plurality of data.

In accordance with another aspect of the present invention, there is provided a semiconductor device including a plurality of synchronization clock generators configured to generate a plurality of synchronization clock signals by mixing phases of source clock signals applied to first and second input ends, a clock transmission path configured to sequentially apply the source clock signal transferred in a forward direction to a first input end of each of the plurality of synchronization clock generators and sequentially applying the source clock signal transferred in a backward direction to a second input end of each of the plurality of synchronization clock generators, and a plurality of data output units configured to synchronize a plurality of data with the plurality of synchronization clock signals and outputting the synchronized plurality of data.

In accordance with another aspect of the present invention, there is provided a method for driving a semiconductor device, including delaying a first source clock signal as much as a time corresponding to a first delay amount within a total delay amount, delaying a second source clock signal having a frequency identical to a frequency of the first source clock signal as much as a time corresponding a second delay amount which is a result of subtracting the first delay amount from the total delay amount, generating a plurality of synchronization clock signal by mixing a phase of the first source clock signal with a phase of the second source clock signal, and synchronizing a plurality of data with the plurality of synchronization clock signals and outputting the synchronized data.

The semiconductor device according to the present embodiment generates a synchronization clock signal using a total delay amount of a clock transmission path. The semiconductor device generates two source clock signals delayed corresponding to the total delay amount and mixes phases of the two source clock signals, thereby generating a plurality of synchronization clock signals toggling at the same time. Therefore, the semiconductor device according to the present embodiment can eliminate a skew problem of a synchronization clock signal by using the plurality of synchronization clock signals and maximally secure a valid data range of a plurality of data outputted after synchronized with the plurality of synchronization clock signals.

DESCRIPTION OF SPECIFIC EMBODIMENTS

Other objects and advantages of the present invention can be understood by the following description, and become apparent with reference to the embodiments of the present invention.

Figure 1:
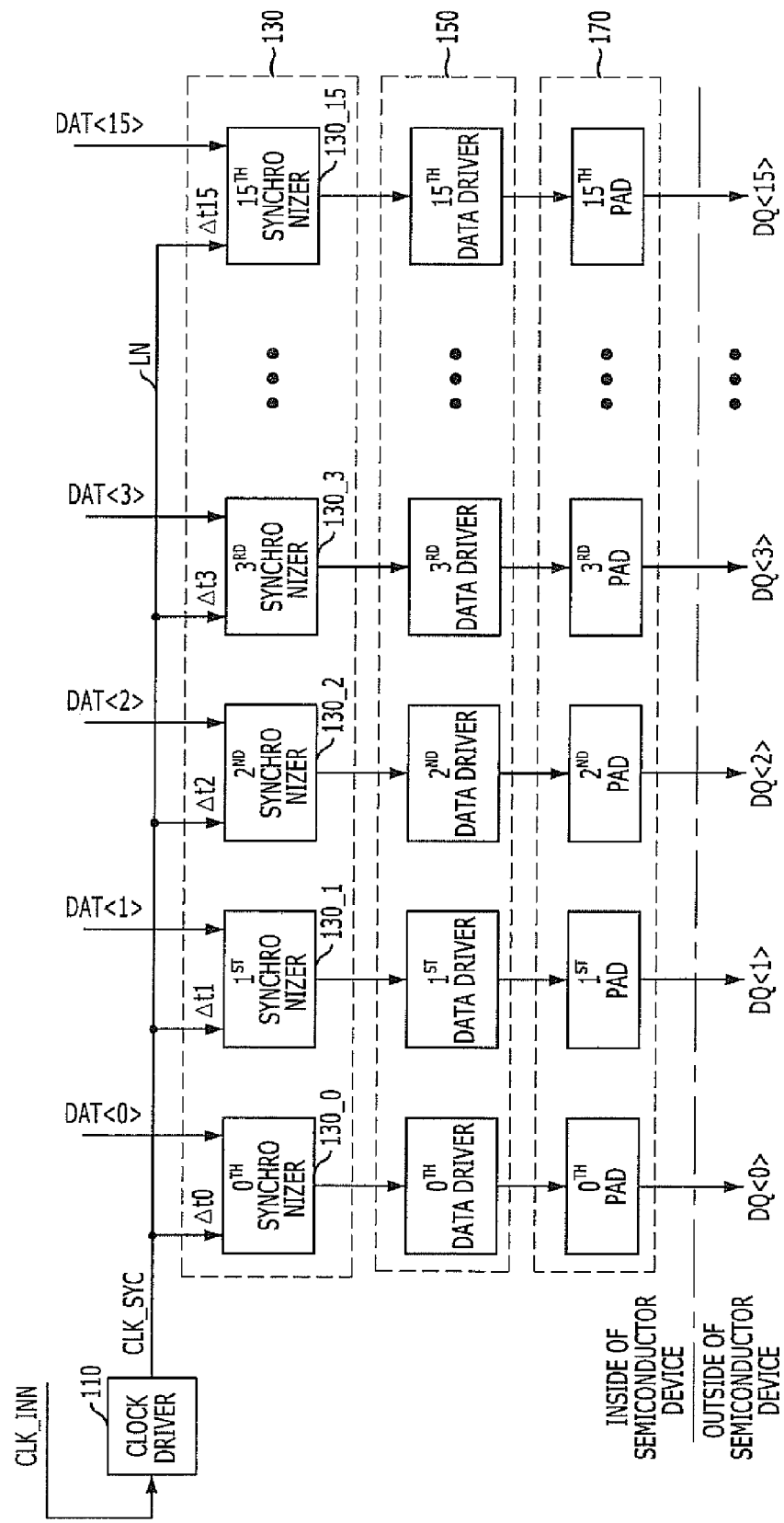
FIG. 1 is a block diagram illustrating a partial structure of a conventional semiconductor device according to the prior art.
Figure 2:
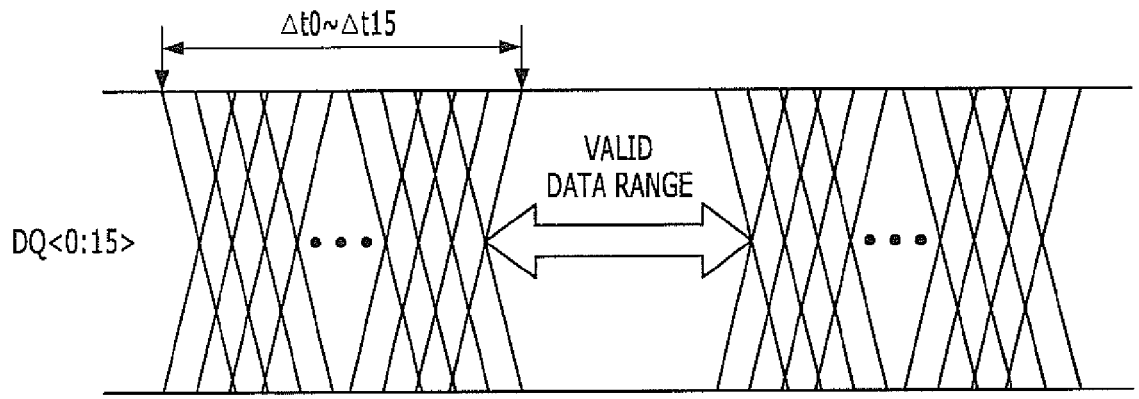
FIG. 2 illustrates $0^{th}$ to $15^{th}$ output data DQ<0:15> outputted from $0^{th}$ to $15^{th}$ pads 170 of FIG. 1.
Figure 3:
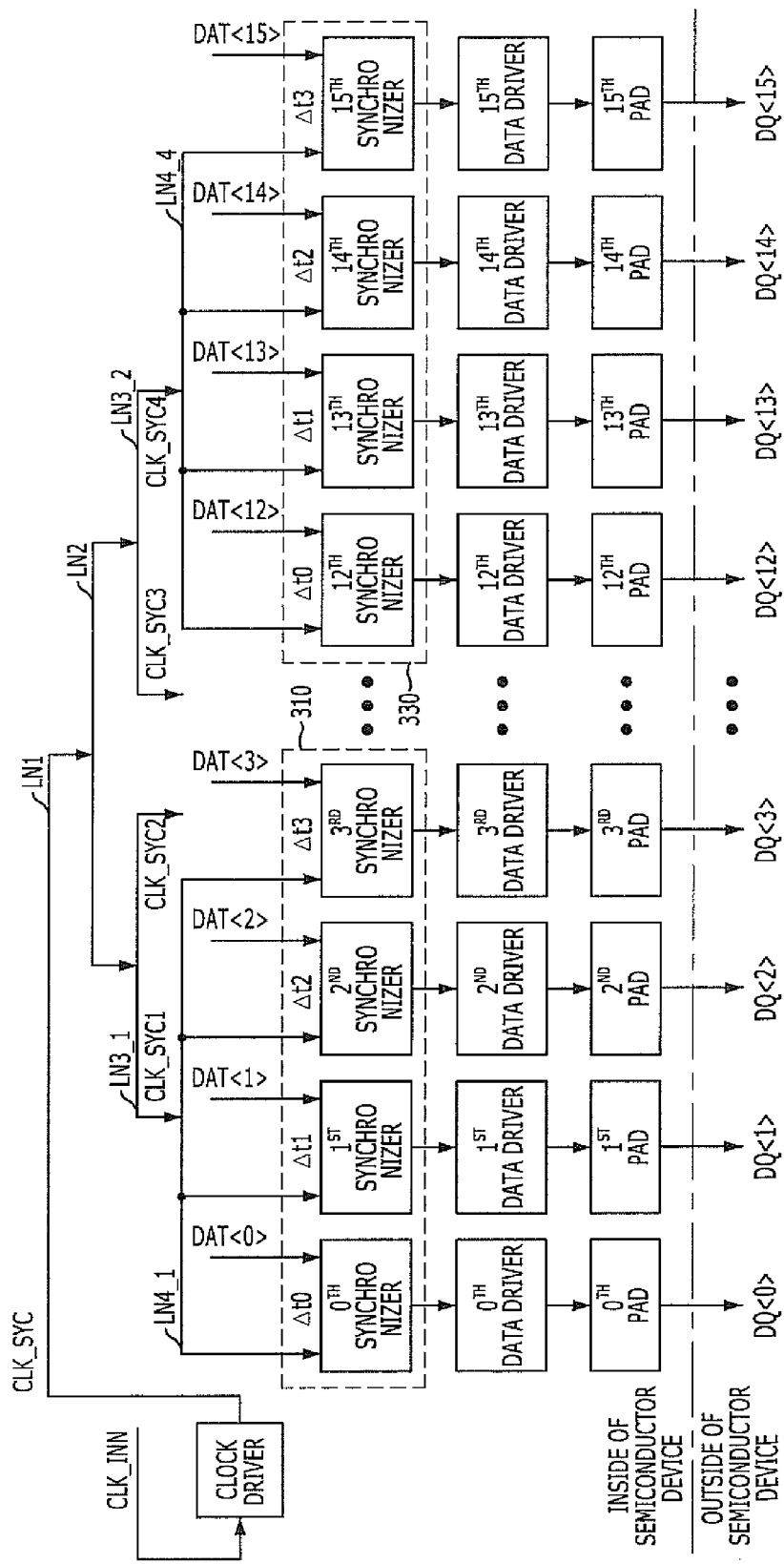
FIG. 3 is a block diagram illustrating another semiconductor device according to the prior art.
Figure 4:
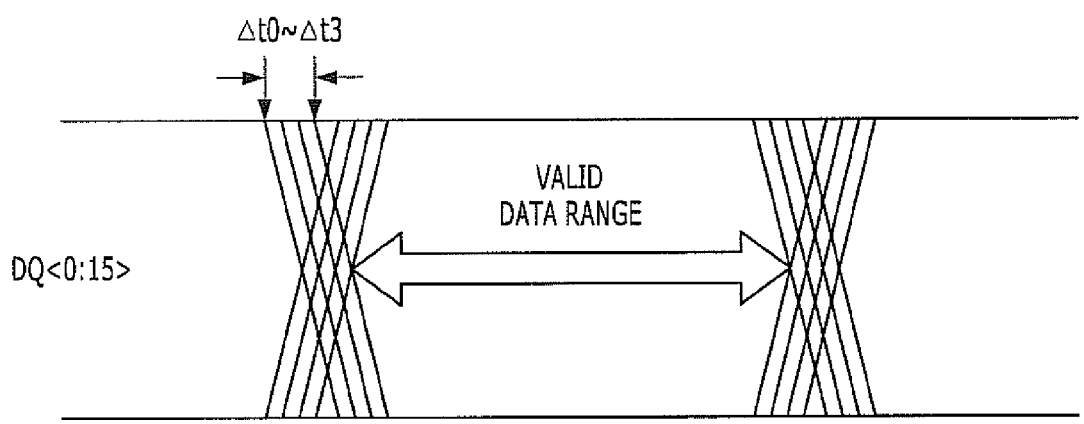
FIG. 4 illustrates $0^{th}$ to $15^{th}$ output data DQ<0:15> outputted from $0^{th}$ to $15^{th}$ pads of FIG. 3.
Figure 5:
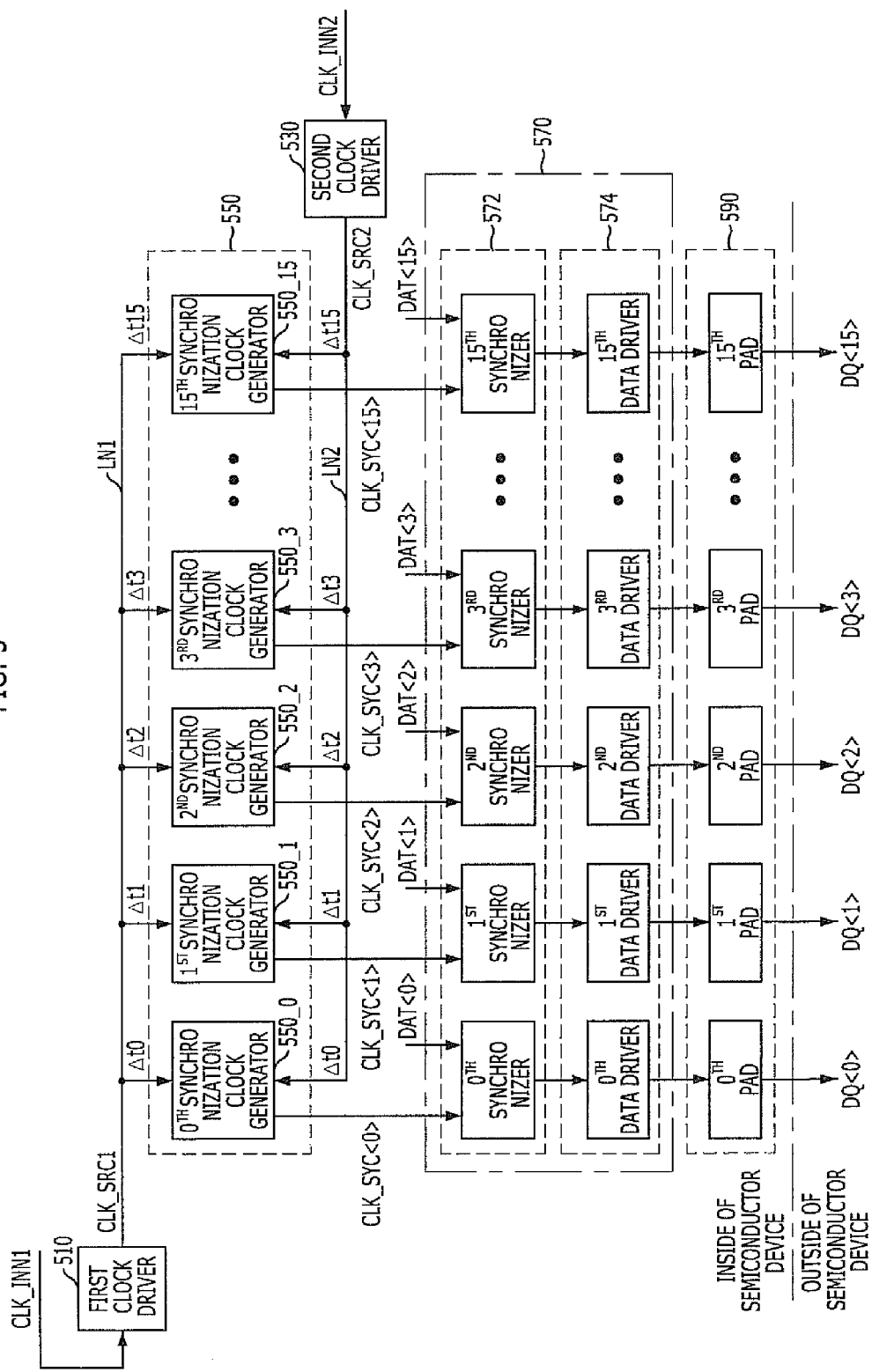
FIG. 5 is a block diagram illustrating a partial structure of a semiconductor device in accordance with a first embodiment of the present invention.

FIG. 5 is a block diagram illustrating a partial structure of a semiconductor device in accordance with a first embodiment of the present invention.

Referring to FIG. 5, the semiconductor device according to the present embodiment includes a first clock driver 510, a second clock driver 530, a plurality of synchronization clock generators 550, a plurality of data output units 570, and a plurality of pads 590. The plurality of data output units 570 includes each of a plurality of synchronizers 572 and a plurality of data drivers 574.

For illustration purposes, FIG. 5 shows the semiconductor device including 16 pads 170, that is, $0^{th}$ to $15^{th}$ PAD as an example. Accordingly, the semiconductor device according to the present embodiment of FIG. 5 includes 16 synchronization clock generators 550 such as $0^{th}$ to $15^{th}$ SYNCHRONIZATION CLOCK GENERATOR, 16 synchronizers 572 such as $0^{th}$ to $15^{th}$ SYNCHRONIZER and 16 data drivers 574 such as $0^{th}$ to $15^{th}$ DATA DRIVER corresponding to the 16 pads.

The first and second clock drivers 510 and 530 generate first and second source clock signals CLK_SRC1 and CLK_SRC2 by buffering a first internal clock signal CLK_INN1 and a second internal clock signal CLK_INN2. The first internal clock signal CLK_INN1 and the second internal clock signal CLK_INN2 may be the same signal and the first source clock signal CLK_SRC1 and the second source clock signal CLK_SCR2 may have the same frequency.

The $0^{th}$ to $15^{th}$ synchronization clock generators 550 may generate a plurality of synchronization clock signals CLK_SYC0, CLK_SYC1, ..., CLK_SYC15 by mixing a phase of the first source clock signal CLK_SRC1 with a phase of the second source clock signal CLK_SRC2. Hereinafter, the plurality of synchronization clock signals CLK_SYC0, CLK_SYC1, ..., CLK_SYC15 will be described in detail.

At first, the first source clock signal cLK_SRC1 may be transferred to the $0^{th}$ to $15^{th}$ synchronization clock generators 550 through the first clock transmission path LN1. Here, the first clock transmission path LN1 may transfer the first source clock signal CLK_SRC1 to the $0^{th}$ to $15^{th}$ synchronization clock generators 550 in a forward direction. The forward direction means that the first source clock signal CLK_SRC1 is applied sequentially to the $0^{th}$ synchronization clock generator 550_0→the first synchronization clock generator 550_1→the second synchronization clock generator 550_2→the third synchronization clock generator 550_3→ ... →the fifteenth synchronization clock generator 550_15 in the order mentioned.

The second source clock signal CLK_SRC2 is transferred through the second clock transmission path LN2 to the $0^{th}$ to $15^{th}$ synchronization clock generators 550. Here, the second clock transmission path LN2 may transfer the second source clock signal CLK_SRC2 in a backward direction to the $0^{th}$ to $15^{th}$ synchronization clock generators 550. The backward direction means the second source clock signal CLK_SRC2 is sequentially applied to the $15^{th}$ synchronization clock generator 550_15→ ... →the $3^{rd}$ synchronization clock generator 550_3→the second synchronization clock generator 550_2→the first synchronization clock generator 550_1→the $0^{th}$ synchronization clock generator 550_0 in the order mentioned.

It is preferable to design the first clock transmission path LN1 and the second clock transmission path LN2 to be physically identical in order to make the first and second clock transmission paths LN1 and LN2 to have the same delay regions.

The $0^{th}$ synchronization clock generator 550_0 may receive a first source clock signal CLK_SRC1 applied in the forward direction corresponding to $\Delta t0$ and a second source clock signal CLK_SRC2 applied in the backward direction corresponding to $\Delta t0$. The $1^{st}$ synchronization clock generator 550_1 may receive the first source clock signal CLK_SRC1 applied in the forward direction corresponding to $\Delta t1$ and the second source clock signal CLK_SRC2 applied in the backward direction corresponding to $\Delta t1$. Similarly, the $2^{nd}$ to $15^{th}$ synchronization clock generators 550_2, 550_3, ..., and 550_15 may receive the first source clock signal CLK_SRC1 applied in the forward direction corresponding to each of $\Delta t$ and the second source clock signal CLK_SRC2 applied in the backward direction corresponding to each of $\Delta t$.

Here, a corresponding reference of $\Delta t$ may be changed according to the forward direction and the backward direction. That is, the $3^{rd}$ synchronization clock generator 550_3 receives the first source clock signal CLK_SRC1 applied in the forward direction and the second source clock signal CLK_SRC2 applied in the backward direction corresponding to $\Delta t3$. Here, the first source clock signal CLK_SRC1 applied in the forward direction corresponding to $\Delta t3$ is the first source clock signal CLK_SRC1 delayed by as much as $\Delta t3$ based on $\Delta t0$. The second source clock signal CLK_SRC2 applied in the backward direction corresponding to $\Delta t3$ is the second source clock signal CLK_SRC2 delayed by as much as $\Delta t3$ based on $\Delta t15$. That is, the first source clock signal CLK_SRC1 is delayed from $\Delta t0$ and applied to the third synchronization clock generator 550_3 at $\Delta t3$. The second source clock signal CLK_SRC2 is delayed from $\Delta t15$ and applied to the third synchronization clock generator 550_3 at $\Delta t3$.

In the semiconductor device according to the present embodiment, the total delay amount of the first source clock signal CLK_SRC1 and the second source clock signal CLK_SRC2 may be always the same in view of the synchronization clock generators 550. That is, the sum of the delay amount of the first source clock signal CLK_SRC1 and the delay amount of the second source clock signal CLK_SRC2, which are applied to one of the 0$^{th}$ to 15$^{th}$ synchronization clock generators 550, is identical to the sum of delay amounts corresponding to the other synchronization clock generators.

For example, in case of the third synchronization clock generator 550_3, the first source clock signal CLK_SRC1 is delayed from Δt0 and applied at Δt3, and the second source clock signal CLK_SRC2 is delayed from Δt15 and applied at Δt3. That is, the sum of the delay amount (Δt0~Δt3) of the first source clock signal CLK_SRC1 and the delay amount (Δt15~Δt3) of the second source clock signal CLK_SRC2 may be the total delay amount (Δt0~Δt15). It means that the second source clock signal CLK_SRC2 has a delay amount as much as a result of subtracting the delay amount of the first source clock signal CLK_SRC1 from the total delay amount.

Meanwhile, the delay amount of the first and second source clock signals CLK_SRC1 and CLK_SRC2 is reflected at a phase of a corresponding source clock signal. That is, a phase of a corresponding source clock signal falls behind as a delay amount increases. On the contrary, the phase of the corresponding source clock signal advances ahead as the delay amount decreases. Although it will be described in detail with reference to FIGS. 6 to 8, the 0$^{th}$ to 15$^{th}$ synchronization clock generators 550 may generate 0$^{th}$ to 15$^{th}$ synchronization clock signals CLK_SYC<0:15> that shift and toggle at the same time point by mixing the phases of the first and second source clock signals, which falls behind or ahead each other.

The plurality of output units 570 synchronize 0$^{th}$ to 15$^{th}$ data DAT<0:15> to the 0$^{th}$ to 15$^{th}$ synchronization clock signals CLK_SYC<0:15> and output the synchronized data. The plurality of output units 570 may include 0$^{th}$ 15$^{th}$ synchronizers 572 and 0$^{th}$ to 15$^{th}$ data drivers 574 as described above.

The 0$^{th}$ to 15$^{th}$ synchronizers 572 synchronize the 0$^{th}$ to 15$^{th}$ data DAT<0:15> with the 0$^{th}$ to 15$^{th}$ synchronization clock signals CLK_SYC<0:15> and output the synchronized data, respectively. Since the 0$^{th}$ to 15$^{th}$ synchronization clock signals CLK_SYC<0:15> according to the present embodiment are shifted and toggled at the same time point, the skew is not reflected in view of the 0$^{th}$ to 15$^{th}$ synchronizers 572.

The 0$^{th}$ to 15$^{th}$ data drivers 574 drive and output the data synchronized and outputted from the 0$^{th}$ 15$^{th}$ synchronizers 572 to the 0$^{th}$ to 15$^{th}$ pads 590. The 0$^{th}$ to 15$^{th}$ data drivers 574 may transfer 0$^{th}$ to 15$^{th}$ output data DQ<0:15> outputted through the 0$^{th}$ to 15$^{th}$ pads 590 to predetermined devices that need the 0$^{th}$ to 15$^{th}$ output data DQ<0:15>.

In the present embodiment, since a skew is not reflected at the 0$^{th}$ to 15$^{th}$ synchronization clock signals CLK_SYC<0:15>, the skew is also not reflected at the 0$^{th}$ to 15$^{th}$ output data DQ<0:15> outputted after synchronized with the 0$^{th}$ to 15$^{th}$ synchronization clock signals CLK_SYC<0:15>. That is, all of the 0$^{th}$ to 15$^{th}$ output data DQ<0:15> may be outputted at the same time point.

Figure 6:
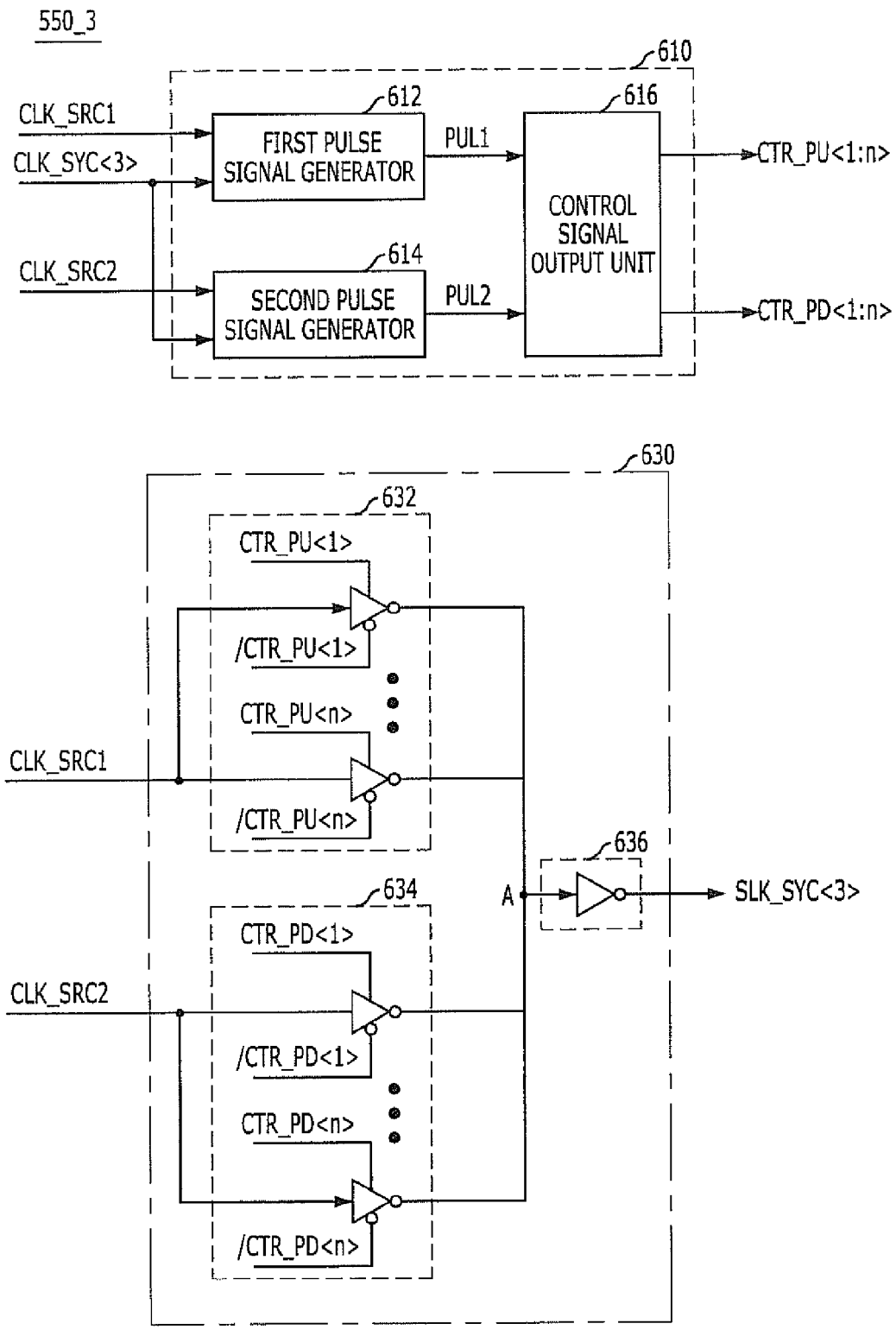
FIG. 6 is a diagram illustrating a plurality of synchronization clock generators 550 of FIG. 5.

FIG. 6 is a diagram illustrating a plurality of synchronization clock generators 550 of FIG. 5. For illustration purposes, the third synchronization clock generator 550_3 will be described representatively.

Referring to FIG. 6, the third synchronization clock generator 550_3 may include a control signal generator 610 and a clock output unit 630.

The control signal generator 610 generates control signals CTR_RU<1:n> and CTR_RD<1:n> corresponding to a phase difference between the first and second source clock signals CLK_SRC1 and CLR_SRC2 where n is an integer number. The control signal generator 610 includes a first pulse signal generator 612, a second pulse signal generator 614, and a control signal output unit 616. The control signals CTR_PU<1:n> and CTR_PD<1:n> may be divided into pull-up control signals CTR_PU<1:n> and pull-down control signals CTR_RD<1:n> for respectively controlling a pull-up driver 632 and a pull-down driver 632 of the clock output unit 630, which will be described later.

The first pulse signal generator 612 may generate a first pulse signal PUL1 in response to the first source clock signal CLK_SRC1 and the third synchronization clock signal CLK_SYC<3> outputted from the clock output unit 630. The second pulse signal generator 614 may generate a second pulse signal PUL2 in response to the source clock signal CLK_SRC2 and the third synchronization clock signal CLK_SYC<3>. The control signal output unit 616 may output the pull-up control signal CTR_PU<1:n> and the pull-down control signals CTR_PU<1:n> in response to the first pulse signal PUL1 and the second pulse signal PUL2. The pull-up control signal CTR_PU<1:n> and the pull-down control signal CTR_PD<1:n> may be a signal for making the pulse widths of the first and second pulse signals PUL1 and PUL2 to be identical. It will be described again with reference to FIGS. 7 and 8.

Figure 7:
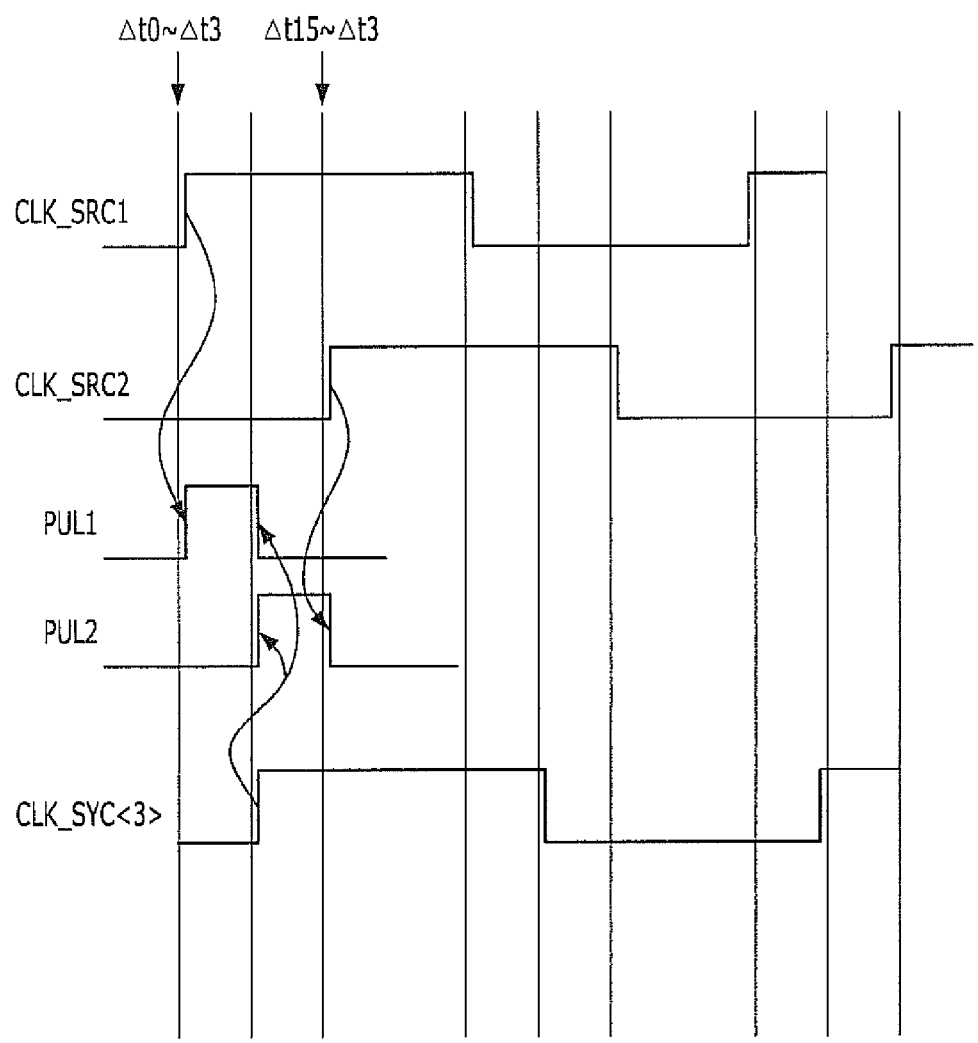
FIG. 7 is a waveform describing an operation of a control signal generator 610 of FIG. 6.

FIG. 7 is a waveform describing an operation of a control signal generator 610 of FIG. 6.

Referring to FIG. 7, the first source clock signal CLK_SRC1 is a signal delayed by as much as Δt0 to Δt3, and the second source clock signal CLK_SRC2 is a signal delayed by as much as Δt15 to Δt3. The first pulse signal PUL1 is activated in response to a rising edge of the first source clock signal CLK_SRC1 and inactivated in response to a rising edge of the third synchronization clock signal CLK_SYC<3>. The second pulse signal PUL2 is activated in response to a rising edge of the third synchronization clock signal CLK_SKY<3> and inactivated in response to a rising edge of the second source clock signal CLK_SRC2. That is, the pulse widths of the first and second pulse signals PUL1 and PUL2 may be defined according to the third synchronization pulse signal CLK_SYC<3> and corresponding one of the first and second source clock signals CLK_SRC1 and CLK_SRC2.

If it is assumed that a time of delaying the first and second source clock signals CLK_SRC1 and CLK_SRC2 is fixed, the pulse widths of the first and second pulse signals PUL1 and PUL2 may be changed according to an activation time of the third synchronization clock signal CLK_SYC<3>. That is, the pulse width of the first pulse signal PUL1 corresponds to a phase difference between the first source clock signal CLK_SRC1 and the third synchronization pulse signal CLK_SYC3. The pulse width of the second pulse signal PUL2 corresponds to a phase difference between the second source clock signal CLK_SRC2 and the third synchronization pulse signal CLK_SYC<3>.

The control signal output unit 616 may generate the pull-up control signals CTR_PU<1:n> and the pull-down control signals CTR_PD<1:n> by comparing a pulse width of the first pulse signal PUL1 with that of the second pulse signal PUL2, in order to make the pulse widths identical. The pull-up control signal CTR_PU<1:n> and the pull-down control signal CTR_RD<1:n> sustain the pulse width of the first pulse signal PUL1 to be identical to the pulse width of the second pulse signal PUL2, and thus, the control the control signal output unit 616 operates based on the middle point between the phases of the first and second source clock signals CLK_SRC1 and CLK_SRC2. However, it is possible to control the control signal output unit 616 to operate based on the other point according to design. The control signal output unit 616 may generate pull-up control signals CTR_PU<1:n> and pull-down control signals CTR_PD<1:n> corresponding to the point.

Referring to FIG. 6, the clock output unit 630 outputs the third synchronization clock signal CLK_SYC<3> in response to the pull-up control signal CTR_PU<1:n> and the pull-down control signal CTR_PD<1:n>. The clock output unit 630 includes the pull-up driver 632, the pull-down driver 634, and a clock driver 636.

The pull-up driver 632 controls a driving power of the first source clock signal CLK_SRC1 in response to the pull-up control signals CTR_PU<1:n> and /CTR_PU<1:n>. The pull-up driver 632 includes a plurality of inverters that are controlled according to the pull-up control signals CTR_PU<1:n> and /CTR_PU<1:n>. The pull-down driver 634 controls a driving power of the second source clock signal CLK_SRC2 in response to the pull-down control signals CTR_PD<1:n> and /CTR_PD<1:n>. The pull-down driver 634 includes a plurality of invertors that are controlled according to the pull-down control signals CTR_PD<1:n> and /CTR_PD<1:n>. The pull-up control signals CTR_PU<1:n> and /CTR_PU<1:n> and the pull-down control signals CTR_PD<1:n> and /CTR_PD<1:n> may be control signals determining whether PMOS transistors and NMOS transistors operate in each inverter or not.

The plurality of inverts in the pull-up driver 632 controls a driving power of the first source clock signal CLK_SRC1 in response to the pull-up control signals CTR_PU<1:n> and /CTR_PU<1:n>. The plurality of inverters in the pull-down driver 634 control a driving power of the second source clock signal CLK_SRC2 in response to the pull-down control signals CTR_PD<1:n> and /CTR_PD<1:n>. That is, the pull-up control signal CTR_PU<1:n> and /CTR_PU<1:n> and the pull-down control signals CTR_PD<1:n> and /CTR_PD<1:n> may be weight code information for applying a weight to the inverters of the pull-up driver 632 and the pull-down driver 634.

The clock driver 636 outputs the third synchronization clock signal CLK_SYC<3> by receiving its input through output nodes A of the pull-up driver 632 and the pull-down driver 634. The clock driver 636 includes an inverter.

Finally, the third synchronization clock generator 550_3 generates the pull-up control signals CTR_PU<1:n> and the pull-down control signal CTR_PD<1:n> for controlling the weight of its clock output unit 630 according to the phases of the first and second source clock signals CLK_SRC1 and CLK_SCR2 and outputs the third synchronization clock signal CLK_SYC<3> by reflecting a weight corresponding to the pull-up and pull-down control signals CTR_PU<1:n> and CTR_PD<1:n> to the first and second source clock signals CLK_SRC1 and CLK_SRC2.

Figure 8:
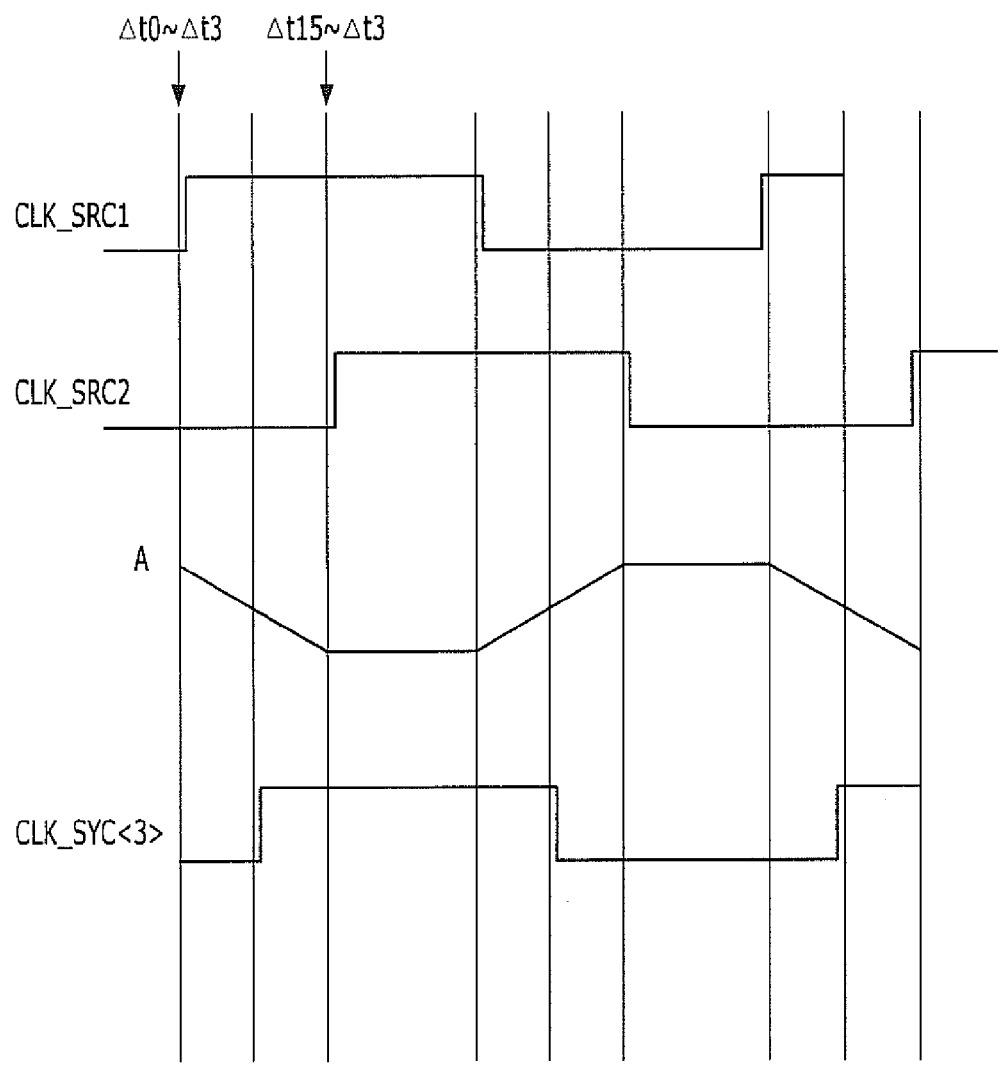
FIG. 8 is a waveform describing operation of a clock output unit 630 of FIG. 6.

FIG. 8 is a waveform for describing operation of a clock output unit 630 of FIG. 6. For illustration purposes, the first source clock signal and the second source clock signal CLK_SRC1 and CLK_SRC2 of FIG. 8 will be described as having the same conditions of those in FIG. 7.

Referring to FIGS. 6 and 8, the control signal generator 610 generates a first pulse signal PUL1 and a second pulse signal PUL2 of which a pulse width is determined according to the phases of the first and second source clock signals CLK_SRC1 and CLK_SRC2 and outputs pull-up control signals CTR_PU<1:n> and pull-down control signals CTR_PD<1:n> according to the generated first and second pulse signals PUL1 and PUL2. The clock output unit 630 controls a driving power of the first source clock signal CLK_SRC1 and the second source clock signal CLK_SRC2 according to the pull-up control signals CTR_PU<1:n> and the pull-down control signals CTR_PD<1:n> And thus, the node A can be driven with corresponding voltage level. The clock driver 636 can output a third synchronization clock signal CLK_SYC<3> according to the voltage level that drives the node A.

If a shifting time of the third synchronization clock signal CLK_SYC<3> is ahead of a scheduled time, e.g., at the middle of the interval between the first and second source clock signals in this embodiment, a pulse width of the first pulse signal PUL1 becomes smaller than the pulse width of the second pulse signal PUL2. The control signal generator 610 generates the pull-up control signals CTR_PU<1:n> and the pull-down control signals CTR_PD<1:n> for making the pulse widths of the first and second pulse signals PUL1 and PUL2 to be identical. Therefore, the pull-up driver 632 and the pull-down driver 634 control a driving power according to a weight of the pull-up control signals CTR_PU<1:n> and the pull-down control signals CTR_PD<1:n>, and the third synchronization clock signal CLK_SYC<3> can be shifted at a scheduled time.

On the contrary, when the shifting time of the third synchronization clock signal CLK_SYC<3> falls behind a scheduled time, the pulse width of the first pulse signal PUL1 becomes greater than the pulse width of the second pulse signal PUL2. Accordingly, the third synchronization clock signal CLK_SYC<3> can be shifted at the scheduled time by the pull-up control signal CTR_PU<1:n> and the pull-down control signal CTR_PD<1:n>.

Finally, in the semiconductor device according to the present embodiment, the sum of the delay amount of the first source clock signal CLK_SRC1 and the delay amount of the second source clock signal CLK_SRC2 becomes always the same, and the $0^{th}$ to $15^{th}$ synchronization clock signals CLK_SYN<0:15> are generated by mixing the phases of the first source clock signal CLK_SRC1 and the second source clock signal CLK_SRC2. Accordingly, it is possible to shift and toggle all of the $0^{th}$ to $15^{th}$ synchronization clock signals CLK_SYN<0:15> at the scheduled time. That is, the $0^{th}$ to $15^{th}$ synchronization clock signals CLK_SYN<0:15> can be applied to the $0^{th}$ to $15^{th}$ synchronizers 572 without a skew. That is, the $0^{th}$ to $15^{th}$ data DQ<0:15> can be outputted at the same time.

Hereinbefore, the circuit configuration and the operation of the third synchronization clock generator 550_3 were described with reference to FIGS. 6 to 8. Such a circuit configuration and operation can be applied identically to other synchronization clock generators. Hereinafter, the fifth synchronization clock generator (not shown) will be described as another example.

The fifth synchronization clock generator may receive a first source clock signal CLK_SRC1 delayed by as much as Δt0 to Δt5 and a second source clock signal CLK delayed by as much as Δt15 to Δt5. That is, the first source clock signal CLK_SRC1 is further delayed by as much as Δt4 & Δt5 and the second source clock signal CLK_SRC2 is less delayed by as much as Δt4 & Δt5 as compared with those of FIGS. 7 and 8. Since the total delay amount of the first source clock signal CLK_SRC1 and the second source clock signal CLK_SRC2 is always the same, the fifth synchronization clock signal CLK_SYC<5> generated by mixing the phases of the first and second source clock signals CLK_SRC1 and CLK_SRC2 can be shifted and toggled at the same time of the third synchronization clock signal CLK_SYC<3>.

Figure 9:
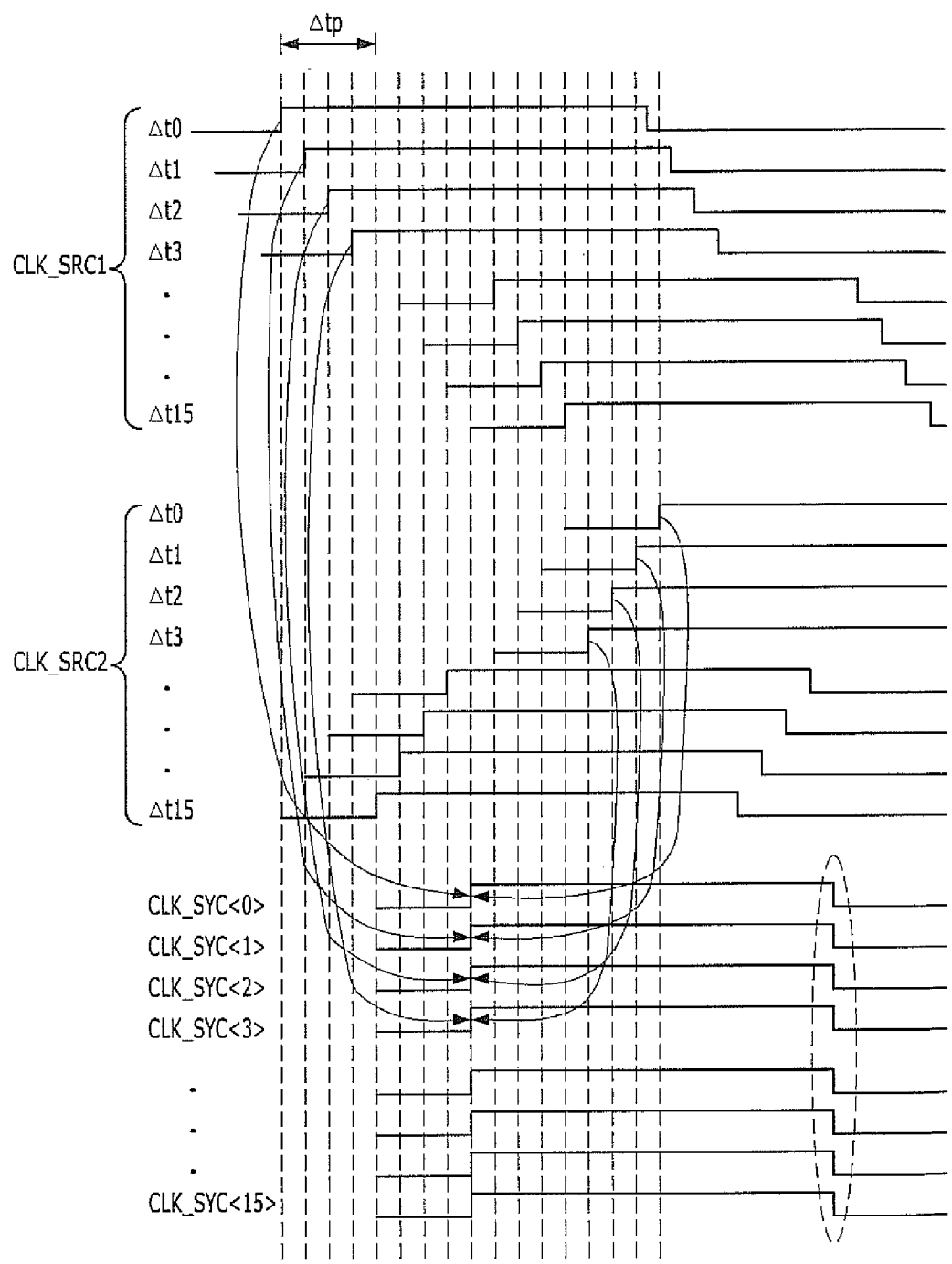
FIG. 9 illustrates waveforms of signals shown in FIG. 5.

FIG. 9 illustrates waveforms of signals shown in FIG. 5. In the drawing, toggling times of the first and second source clock signals CLK_SRC1 and CLK_SRC2 are different (by Δtp). In the present embodiment, a semiconductor device can normally operate not only when the first source clock signal CLK_SRC1 and the second source clock signal CLK_SRC2 are toggled at the same time, but when the first source clock signal CLK_SRC1 and the second source clock signal CLK_SRC2 are toggled at the different time as shown in FIG. 9. When the first source clock signal CLK_SRC1 and the second source clock signal CLK_SRC2 are toggled at the same time, the total delay amount thereof corresponds to the maximum delay amount of one of the first source clock signal CLK_SRC1 and the second source clock signal CLK_SRC2. However, when the first source clock signal CLK_SRC1 and the second source clock signal CLK_SRC2 are toggled at the different time points, the total delay amount may further include a delay time corresponding to a phase difference Δtp between the first source clock signal CLK_SRC1 and the second source clock signal CLK_SRC2.

Referring to FIG. 9, the total delay time including Δtp of the first source clock signal CLK_SRC1 and the second source clock signal CLK_SRC2 corresponding to each other is always the same. Therefore, the $0^{th}$ to $15^{th}$ synchronization clock signals CLK_SYC<0:15>, which are generated by mixing the phases of the first and second source clock signals CLK_SRC1 and CLK_SRC2, can be shifted and toggled at the same time.

Figure 10:
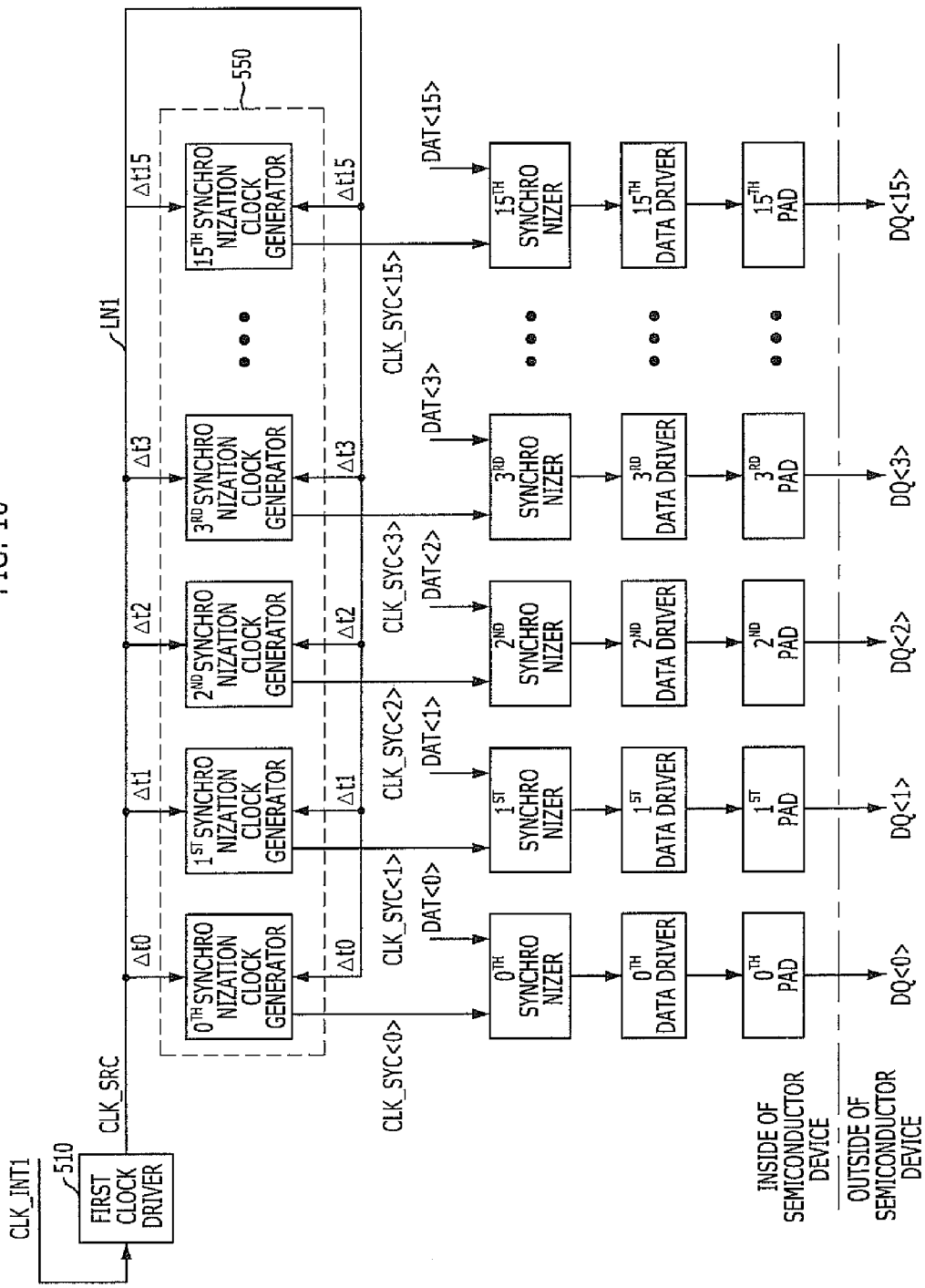
FIG. 10 is a block diagram illustrating a partial structure of a semiconductor device in accordance with a second embodiment of the present invention.

FIG. 10 is a block diagram illustrating a partial structure of a semiconductor device in accordance with a second embodiment of the present invention. For illustration purposes, like numeral references denote like elements in FIGS. 5 and 10. Compared to the semiconductor device of FIG. 5, the semiconductor device of FIG. 10 has a different clock transmission path for transferring a source clock signal.

Referring to FIG. 10, the semiconductor device according to the present embodiment inputs a source clock signal CLK_SRC to a plurality of synchronization clock generator 550 in a forward direction and in a backward direction through a clock transmission path LN1. That is, the semiconductor device of FIG. 10 may include one clock transmission path LN1 while the semiconductor device of FIG. 5 includes two clock transmission paths LN1 and LN2 (see FIG. 5).

Each of the plurality of synchronization clock generators 550, as shown in FIG. 6, includes a first input end and a second input end wherein the first source clock signal CLK_SRC1 and the second source clock signal CLK_SRC2 are inputted in FIG. 6. The clock transmission path LN1 sequentially applies the source clock signal CLK_SRC transferred in a forward direction to the first input ends of the $0^{th}$ to $15^{th}$ synchronization clock generators 550. Then, the clock transmission path LN1 sequentially applies the source clock signal CLK_SRC transferred in a backward direction to the second input ends of the $15^{th}$ to $0^{th}$ synchronization clock generators 550.

Here, the clock transmission path LN1 may include a forward direction transmission region for transferring a source clock signal CLK_SRC in a forward direction and a backward direction transmission region for transferring the source clock signal CLK_SRC in a backward direction. It is preferable that each delay region of the forward delay region has the same delay time of corresponding delay region of the backward transmission region by designing the forward transmission region and the backward transmission region to have a physically identical structure.

The semiconductor device of FIG. 10 uses one source clock signal CLK_SRC and transfers the source clock signal CLK_SRC through one clock transmission path LN1 unlike the semiconductor device of FIG. 5. However, when the semiconductor device of FIG. 5 receives the second source clock signal CLK_SRC2 delayed by as much as a delay time reflected in the forward direction transmission region of FIG. 10, the first source clock signal CLK_SRC1 and the second source clock signal CLK_SRC2 applied to a plurality of synchronization clock generators 550 of FIG. 5 have the similar operation of the source clock signal CLK_SRC applied to the first and second input ends of the plurality of the synchronization clock generators 550 of FIG. 10.

Figure 11:
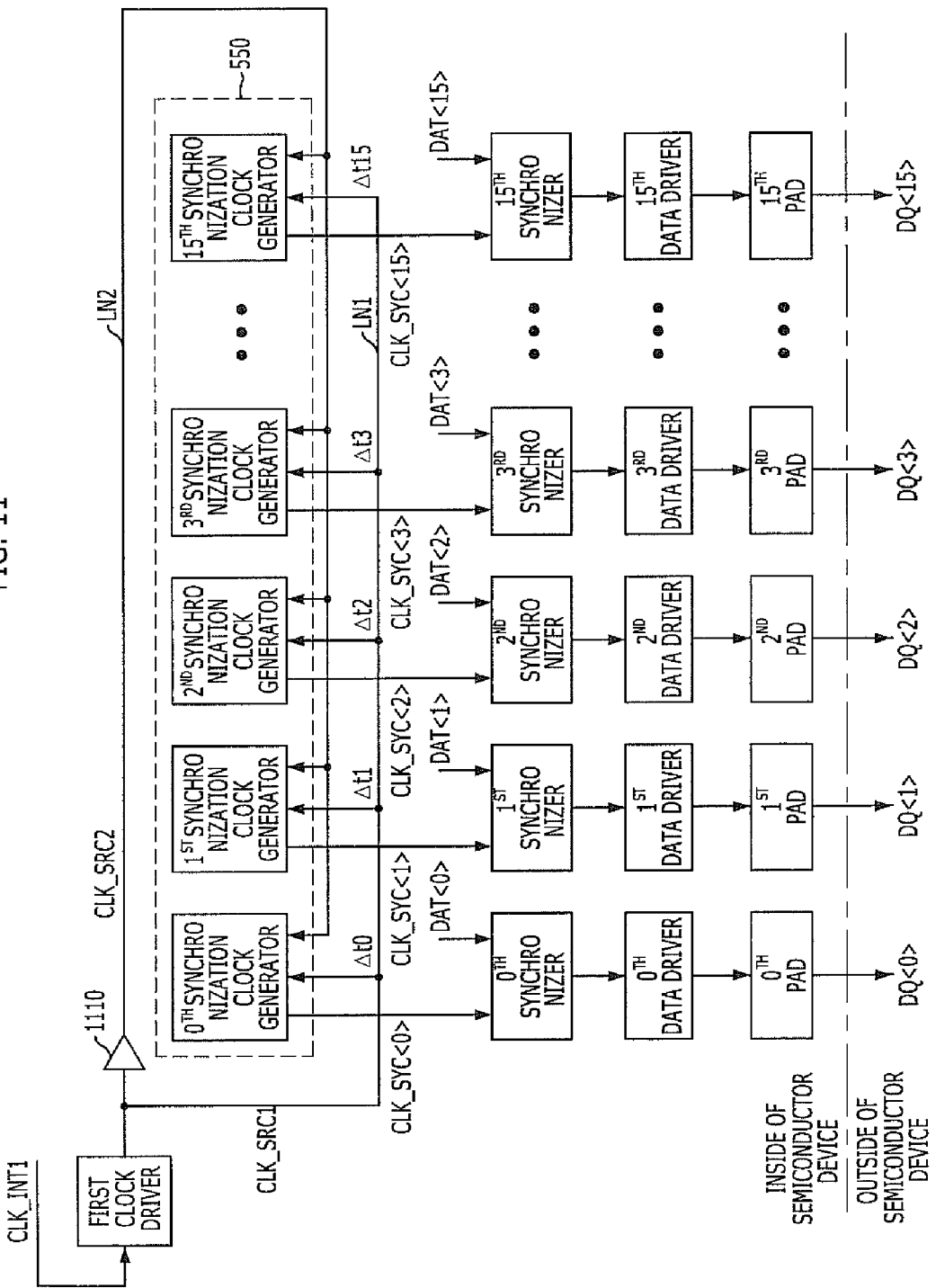
FIG. 11 is a block diagram illustrating a partial structure of a semiconductor device in accordance with a third embodiment of the present invention.

FIG. 11 is a block diagram illustrating a partial structure of a semiconductor device in accordance with a third embodiment of the present invention. For convenience, like numeral references denote like element in FIGS. 5 and 11. Compared to the semiconductor device of FIG. 5, the semiconductor device of FIG. 11 has a different clock transmission path and further includes a buffering unit 1110.

Referring to FIG. 11, the buffering unit 1110 outputs a second source clock signal CLK_SRC2 by buffering a first source clock signal CLK_SRC. Here, the buffering unit 1110 may be disposed on the second clock transmission path LN2 and the position thereof may differ according to design.

The semiconductor device according to the present embodiment may include a first clock transmission path LN1 for sequentially applying a first source clock signal CLK_SRC1 transferred in a forward direction to a plurality of synchronization clock generators 550 and a second clock transmission path LN2 for sequentially applying second source clock signals CLK_SRC2 transferred in a backward direction to the plurality of synchronization clock generators 550.

Unlike the semiconductor device of FIG. 5, the semiconductor device of FIG. 11 uses the second source clock signal CLK_SRC2 based on the first source clock signal CLK_SRC1. Also, the semiconductor device of FIG. 11 has a smaller number of source clock signals transferred to the plurality of synchronization clock generators 550 from one clock transmission path compared to the semiconductor device of FIG. 10. That is, the semiconductor device of FIG. 10 uses one clock transmission path to transfer a source clock signal to the plurality of synchronization clock generators 550. Therefore, one clock transmission path of the semiconductor device of FIG. 10 should deal with all loading corresponding to each input end of the plurality of synchronization clock generators 550. However, the semiconductor device of FIG. 11 includes two clock transmission paths such as the first and second clock transmission paths LN1 and LN2 for applying a source clock signal to the plurality of synchronization clock generators 550. Therefore, the burden of the first and second clock transmission paths LN1 and LN2 is reduced in the semiconductor device of FIG. 11.

Figure 12:
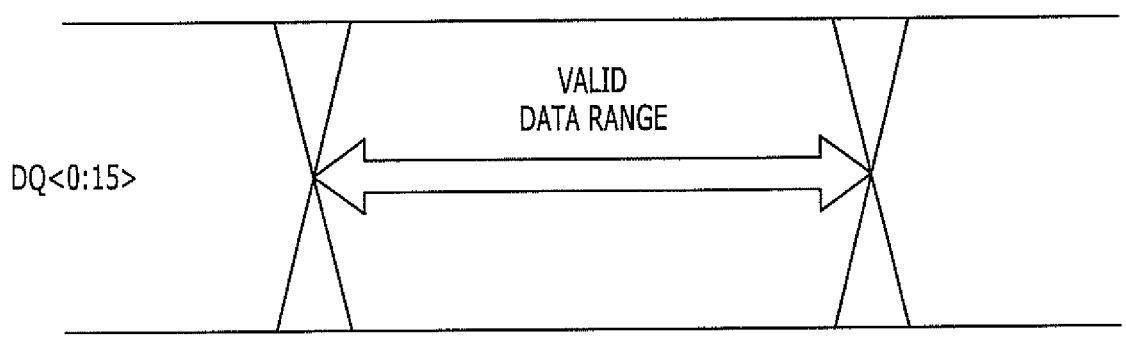
FIG. 12 illustrates $0^{th}$ to $15^{th}$ output data DQ<0:15> in accordance with an embodiment of the present invention.

FIG. 12 is a diagram illustrating $0^{th}$ to $15^{th}$ output data DQ<0:15> in accordance with an embodiment of the present invention.

As shown in FIG. 12, the $0^{th}$ to $15^{th}$ output data DQ<0:15> may be outputted at the same time. Therefore, a valid data range may be extended to a real data range. Such an extended valid data range improves the reliability of the semiconductor device and other devices requiring the $0^{th}$ to $15^{th}$ output data DQ<0:15>.

As described above, the semiconductor device according to the present invention can shift and toggle the $0^{th}$ to $15^{th}$ synchronization clock signals CLK_SYC<0:15> at the same time. Therefore, the semiconductor device according to the present embodiment can output a plurality of output data DQ<0:15> at the same time. That is, the semiconductor device according to the present embodiment may avoid a skew problem. Accordingly, it is possible to extend a valid data range of the output data DQ<0:15> to a real data range, thereby improving the reliability of transferring data to other devices.

Also, it is possible to reduce limitation of designing a layout by effectively disposing clock transmission paths for transferring a source clock signal without layering the clock transmission paths.

Embodiments of the present invention relate to a semiconductor device for synchronizing a plurality of data with a synchronization clock signal and outputting the synchronized data and a driving method thereof for generating the synchronization clock signal.

According to the embodiments of the present invention, it is possible to maximally secure a valid data range of a plurality of synchronized and outputted data by generating a plurality of synchronization clock signals at the same time without a skew.

Also, it is possible to reduce limitation of designing a layout by effectively disposing a clock transmission path for transferring a source clock signal of the plurality of synchronization clock signals without layering the clock transmission path.

While the present invention has been described with respect to the specific embodiments, it will be apparent to those skilled in the art that various changes and modifications may be made without departing from the spirit and scope of the invention as defined in the following claims.

Although the embodiments of the present invention were described to use a plurality of inverters for mixing phases of source clock signals, the present invention is not limited thereto. The present invention can be identically applied to other circuits, for example, a circuit using a charge pumping method. The embodiments of the present invention were described to have an ideal duty cycle ratio of an internal clock signal. However, the embodiments of the present invention may further include a circuit for correcting a duty ratio of an internal clock signal in the front of or in the rear of the clock driver when the internal clock signal is not ideal.

Although the embodiments of the present invention were described to have digital type of the pull-up control signals CTR_PU<1:n> and /CTR_PU<1:n> and the pull-down control signals CTR_PD<1:n> and /CTR_PD<1:n> as weight codes, the present invention may be identically applied to analog type control signals. Furthermore, locations and types of logic gates and transistors may differ according to polarity of an input signal.

What is claimed is:

1. A semiconductor device, comprising:
 a plurality of synchronization clock generators configured to generate a plurality of synchronization clock signals by mixing phases of first and second source clock signals having an identical frequency; and
 a plurality of data output units configured to synchronize a plurality of data with the plurality of synchronization clock signals and outputting the synchronized plurality of data,
 wherein the first source clock signal is sequentially applied to the synchronization clock generators in a first order of the synchronization clock generators, the second source clock signal is sequentially applied to the synchronization clock generators in an opposite order of the synchronization clock generators from the first order, the first order is from first to n-th synchronization clock generators, and n is a natural number.

2. The semiconductor device of claim 1, wherein the first source clock signal is applied to the plurality of synchronization clock generators in a forward direction, wherein the second source clock signal is applied to the plurality of synchronization clock generators in a backward direction.

3. The semiconductor device of claim 2, further comprising:
 a first clock transmission path configured to sequentially apply the first source clock signal to the plurality of synchronization clock generators by transferring the first source clock signal in the forward direction; and
 a second clock transmission path configured to sequentially apply the second source clock signal to the plurality of synchronization clock generators by transferring the second source clock signal in the backward direction.

4. The semiconductor device of claim 3, wherein the second source clock signal is delayed by a delay time reflected at the first clock transmission path.

5. The semiconductor device of claim 3, wherein the second clock transmission path generates the second source clock signal by delaying the first source clock signal by a delay time reflected at the first clock transmission path and transfers the second source clock signal to the plurality of synchronization clock generators.

6. The semiconductor device of claim 3, wherein each delay region of the first clock transmission path has a delay time identical to a delay region of the second clock transmission path.

7. The semiconductor device of claim 3, wherein the second clock transmission path includes a buffering unit configured to buffer the first source clock signal.

8. The semiconductor device of claim 3, wherein the first source clock signal is applied to the synchronization clock generators in the forward direction through the first clock transmission path and the second source clock signal is applied to the synchronization clock generators in the backward direction through the second clock transmission path.

9. The semiconductor device of claim 1, wherein each of the plurality of synchronization clock generators mixes a phase of the first source clock signal with a phase of the second source clock signal in response to a control signal.

10. The semiconductor device of claim 1, wherein each of the plurality of synchronization clock generators includes:
 a control signal generator configured to generate a control signal corresponding to a phase difference between the first source clock signal and the second source clock signal; and
 a clock output unit configured to output a corresponding synchronization clock signal in response to the control signal.

11. The semiconductor device of claim 10, wherein the control signal generator includes:
 a first pulse signal generator configured to generate a first pulse signal in response to the first source clock signal and the corresponding synchronization clock signal;
 a second pulse signal generator configured to generate a second pulse signal in response to the second source clock signal and the corresponding synchronization clock signal; and
 a control signal output unit configured to output the control signal corresponding to the first and second pulse signals.

12. The semiconductor device of claim 10, wherein the clock output unit includes:
 a first driver configured to control a driving power of the first source clock signal in response to the control signal;
 a second driver configured to control a driving power of the second source clock signal in response to the control signal; and a clock driver configured to output the corresponding synchronization clock signal by being driven according to output signals of the first and second drivers.

13. The semiconductor device of claim 1, wherein the plurality of data output units includes:
   a plurality of synchronizers configured to synchronize the plurality of data with the plurality of synchronization clock signals; and
   a plurality of data drivers configured to drive a plurality of pads in response to output signals of the plurality of synchronizers.

14. A semiconductor device, comprising:
   a plurality of synchronization clock generators configured to generate a plurality of synchronization clock signals, respectively, by each mixing phases of source clock signals applied to first and second input ends thereof; and
   a plurality of data output units configured to synchronize a plurality of data with the plurality of synchronization clock signals and outputting the synchronized plurality of data,
   wherein a first source clock signal is sequentially applied to the first ends of the synchronization clock generators in time in a first order of the synchronization clock generators, a second source clock signal is sequentially applied to the second ends of the synchronization clock generators in an opposite order of the synchronization clock generators from the first order, the first order is from first to n-th synchronization clock generators, and n is a natural number.

15. The semiconductor device of claim 14, wherein the sequentially applied first and second source clock signals are respectively transferred in a forward direction to the first input end of each of the plurality of synchronization clock generators and transferred in a backward direction to the second input end of each of the plurality of synchronization clock generators.

16. The semiconductor device of claim 15, further comprising:
   a clock transmission path configured to sequentially apply the first source clock signal transferred in the forward direction to the first input end of each of the plurality of synchronization clock generators and sequentially applying the second source clock signal transferred in the backward direction to the second input end of each of the plurality of synchronization clock generators.

17. The semiconductor device of claim 16, wherein the clock transmission path includes:
   a forward transmission region configured to transfer the first source clock signal in the forward direction; and
   a backward transmission region configured to transfer the second source clock signal transferred through the forward transmission region in the backward direction.

18. The semiconductor device of claim 16, wherein each delay region of the forward transmission region has a delay time identical to a delay region of the backward transmission region.

19. The semiconductor device of claim 16, wherein each of the plurality of synchronization clock generators mixes a phase of the first source clock signal inputted to the first input end with a phase of the second source clock signal inputted to the second input end in response to a control signal.

20. The semiconductor device of claim 16, wherein each of the plurality of synchronization clock generators includes:
   a control signal generator configured to generate a control signal corresponding to a phase difference between the first source clock signal inputted to the first input end and the second source clock signal inputted to the second input end; and
   a clock output unit configured to output a corresponding synchronization clock signal in response to the control signal.

21. The semiconductor device of claim 20, wherein the control signal generator includes:
   a first pulse signal generator configured to generate a first pulse signal in response to the first source clock signal inputted to the first input end and the corresponding synchronization clock signal;
   a second pulse signal generator configured to generate a second pulse signal in response to the second source clock signal inputted to the second input end and the corresponding synchronization clock signal; and
   a control signal output unit configured to output the control signal corresponding to the first and second pulse signals.

22. The semiconductor device of claim 20, wherein the clock output unit includes:
   a first driver configured to control a driving power of the source clock signal inputted to the first input end in response to the control signal;
   a second driver configured to control a driving power of the source clock signal inputted to the second input end in response to the control signal; and
   a clock driver configured to output the corresponding synchronization clock signal by being driven according to output signals of the first and second drivers.

23. The semiconductor device of claim 16, wherein the plurality of data output units includes:
   a plurality of synchronizers configured to synchronize the plurality of data with the plurality of synchronization clock signals; and
   a plurality of data drivers configured to drive a plurality of pads in response to an output signal of the plurality of synchronizers.

24. The semiconductor device of claim 16, wherein the first source clock signal is applied to the first input ends of the synchronization clock generators in the forward direction through the clock transmission path and the second source clock signal is applied to the second input ends of the synchronization clock generators in the backward direction through the clock transmission path.

25. A method for driving a semiconductor device, comprising:
   obtaining phases of a first source clock signal by delaying the first source clock signal by respective first delay amounts;
   obtaining phases of a second source clock signal by delaying the second source clock signal by respective second delay amounts, wherein the second source clock signal has a frequency identical to a frequency of the first source clock signal;
   generating a plurality of synchronization clock signals by mixing phases of the first source clock signal with respective phases of the second source clock signal, wherein for each synchronization clock signal, a sum of the first delay amount of the respective phase of the first source clock signal and the second delay amount of the respective phase of the second source clock signal equals a same total delay amount.

26. The method of claim 25, wherein as the first delay amounts of the phases of the first source clock signal progressively increase, the second delay amounts of the corresponding mixed phases of the second source clock signal progressively decrease.

27. The method of claim 25, wherein the generating of the plurality of synchronization clock signals includes:
   generating a weight code corresponding to the phases of the first source clock signal and the second source clock signal; and
   outputting a corresponding synchronization clock signal by reflecting the weight code on the first and second source clock signals.

28. The method of claim 27, wherein the generating of the weight code includes:
   determining a first pulse width according to the first source clock signal and the corresponding synchronization clock signal;
   determining a second pulse width according to the second source clock signal and the corresponding synchronization clock signal; and
   outputting the weight code according to the first pulse width and the second pulse width.

29. The method of claim 28, wherein the first pulse width and the second pulse width correspond to a phase difference between the first source clock signals and the corresponding synchronization clock signal and a phase difference between the second source clock signal and the corresponding synchronization clock signal, respectively.

30. The method of claim 25, wherein the same total delay amount includes a delay amount corresponding to a phase difference between the first source clock signal and the second source clock signal.

* * * * *